United States Patent
Wilson et al.

(10) Patent No.: US 11,696,397 B2
(45) Date of Patent: Jul. 4, 2023

(54) PATTERNED BONDED GLASS LAYERS IN ELECTRONIC DEVICES

(71) Applicant: Apple Inc., Cupertino, CA (US)

(72) Inventors: James R. Wilson, Cupertino, CA (US); Matthew S. Rogers, San Jose, CA (US)

(73) Assignee: Apple Inc., Cupertino, CA (US)

(*) Notice: Subject to any disclaimer, the term of this patent is extended or adjusted under 35 U.S.C. 154(b) by 714 days.

(21) Appl. No.: 15/967,383

(22) Filed: Apr. 30, 2018

(65) Prior Publication Data
US 2019/0037690 A1 Jan. 31, 2019

Related U.S. Application Data

(60) Provisional application No. 62/539,454, filed on Jul. 31, 2017.

(51) Int. Cl.
| | |
|---|---|
| *H05K 5/00* | (2006.01) |
| *H05K 1/03* | (2006.01) |
| *G09F 3/02* | (2006.01) |
| *G02B 5/28* | (2006.01) |
| *C03C 17/22* | (2006.01) |

(Continued)

(52) U.S. Cl.
CPC ........... *H05K 1/0306* (2013.01); *C03C 17/22* (2013.01); *C03C 27/10* (2013.01); *G02B 5/285* (2013.01); *G09F 3/02* (2013.01); *H04M 1/0283* (2013.01); *H05K 5/0017* (2013.01); *H05K 5/0243* (2013.01); *H05K 5/03* (2013.01);

(Continued)

(58) Field of Classification Search
CPC .. H05K 1/0306; H05K 5/0017; H05K 5/0243; H05K 5/03; C03C 17/22; C03C 27/10; G02B 5/285; G09F 3/02; H04M 1/0283
See application file for complete search history.

(56) References Cited

U.S. PATENT DOCUMENTS

| | | | |
|---|---|---|---|
| 8,824,140 B2 * | 9/2014 | Prest | H05K 5/0086 |
| | | | 361/679.56 |
| 10,254,451 B2 * | 4/2019 | Jin | G06F 1/1637 |

(Continued)

FOREIGN PATENT DOCUMENTS

| | | |
|---|---|---|
| CN | 204644191 U | 9/2015 |
| CN | 206306573 U | 7/2017 |

(Continued)

*Primary Examiner* — Anthony Q Edwards
*Assistant Examiner* — Hung Q Dang
(74) *Attorney, Agent, or Firm* — Treyz Law Group, P.C.; G. Victor Treyz; David K. Cole

(57) ABSTRACT

An electronic device may include electrical components and other components mounted within an interior of a housing. The device may have a display on a front face of the device and may have a glass layer that forms a housing wall on a rear face of the device. The glass housing wall may be provided with regions having different appearances. The regions may be textured, may have coatings such as thin-film interference filter coatings formed from stacks of dielectric material having alternating indices of refraction, may have metal coating layers, and/or may have ink coating layers. Textured surfaces, cavities, coatings, and other decoration may be embedded in glass structures that are joined with chemical bonds at diffusion-bonding interfaces.

17 Claims, 6 Drawing Sheets

(51) Int. Cl.
*C03C 27/10* (2006.01)
*H04M 1/02* (2006.01)
*H05K 5/02* (2006.01)
*H05K 5/03* (2006.01)

(52) U.S. Cl.
CPC ... *G09F 2003/0276* (2013.01); *H04M 1/0266* (2013.01); *H05K 2201/0195* (2013.01)

(56) References Cited

U.S. PATENT DOCUMENTS

| | | | |
|---|---|---|---|
| 2006/0118102 A1* | 6/2006 | Wermbter | C03C 17/36 126/211 |
| 2009/0046240 A1 | 2/2009 | Bolton | |
| 2011/0012873 A1 | 1/2011 | Prest et al. | |
| 2012/0050975 A1* | 3/2012 | Garelli | G06F 1/1615 361/679.27 |
| 2012/0120682 A1 | 5/2012 | Sasagawa et al. | |
| 2013/0083506 A1 | 4/2013 | Wright et al. | |
| 2014/0085317 A1 | 3/2014 | Lavery et al. | |
| 2014/0139978 A1 | 5/2014 | Kwong | |
| 2015/0010721 A1 | 1/2015 | Tanida et al. | |
| 2016/0113135 A1 | 4/2016 | Kim et al. | |
| 2016/0255735 A1 | 9/2016 | Han et al. | |
| 2017/0129218 A1* | 5/2017 | Cleary | B32B 17/06 |
| 2017/0146710 A1 | 5/2017 | Jin et al. | |
| 2017/0184762 A1 | 6/2017 | Fujii et al. | |
| 2017/0291849 A1* | 10/2017 | Dejneka | C03C 21/002 |
| 2018/0262029 A1* | 9/2018 | Miller | H02J 7/02 |
| 2019/0223285 A1* | 7/2019 | Sivano De Sousa | H01L 23/3735 |

FOREIGN PATENT DOCUMENTS

| | | |
|---|---|---|
| EP | 2761391 B1 | 7/2019 |
| TW | 201343573 A | 11/2013 |
| TW | 201520650 A | 6/2015 |
| TW | 201525542 A | 7/2015 |
| TW | 201528912 A | 7/2015 |

* cited by examiner

PATTERNED BONDED GLASS LAYERS IN ELECTRONIC DEVICES

This application claims the benefit of provisional patent application No. 62/539,454, filed Jul. 31, 2017, which is hereby incorporated by reference herein in its entirety.

BACKGROUND

This relates generally to electronic devices, and, more particularly, to forming visually distinguishable regions in glass structures in electronic devices.

Electronic devices such as cellular telephones, computers, watches, and other devices may contain glass structures. For example, electronic devices may have displays in which an array of pixels is covered with a transparent layer of glass. In some devices, a rear housing wall may be covered with a layer of glass. A decorative layer may be applied to the layer of glass to help improve the appearance of the rear housing wall.

SUMMARY

An electronic device may include electrical components and other components mounted within an interior of a housing. The device may have a display on a front face of the device and may have a glass housing wall on an opposing rear face of the device. The glass housing wall may be provided with regions having different appearances. The regions may be textured, may have coatings such as thin-film interference filter coatings formed from stacks of dielectric material having alternating indices of refraction, may have metal coating layers, and/or may have ink coating layers.

Textured surfaces, cavities, coatings, and other decoration may be embedded in glass structures that are joined with chemical bonds at diffusion-bonding interfaces. The decoration may, for example, be embedded in a glass housing wall having layers that are joined with chemical bonds at diffusion-bonding interfaces.

DETAILED DESCRIPTION

Figure 1:
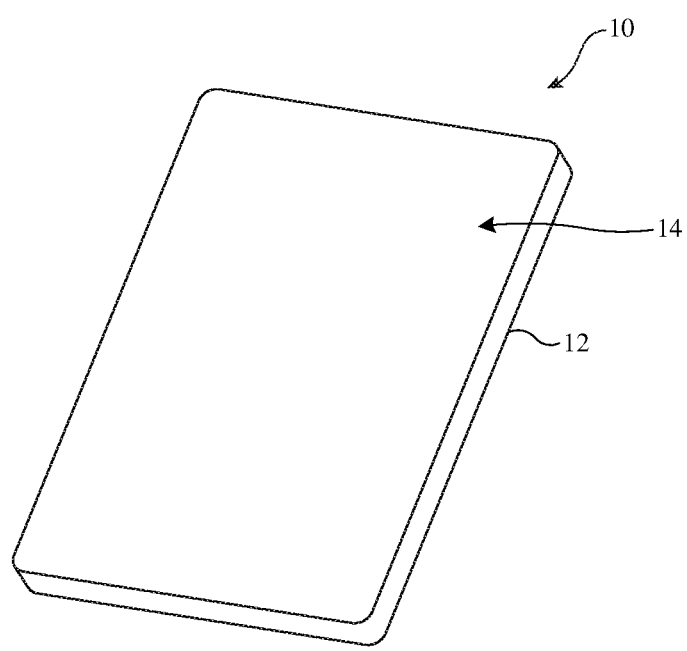
FIG. 1 is a perspective view of an illustrative electronic device in accordance with an embodiment.

Electronic devices and other items may be provided with structures that are formed from transparent materials. For example, an electronic device may include a display. The display may have an array of pixels for displaying images for a user. To protect the pixel array from damage, the display may be covered with a layer of transparent material that serves as a display cover layer. The transparent material may be ceramic, polymer, crystalline material such as sapphire, or other suitable transparent material. Configurations in which such layers are formed from glass are sometimes described herein as an example. Portions of electronic devices such as optical windows, buttons, housing walls (e.g., rear housing walls and/or sidewalls), and other structures other than display cover layers may also be formed from ceramic, polymer, crystalline material such as sapphire, and/or glass and may be clear or may be colored. For example, the rear face of an electronic device may be covered with a layer of glass that forms a rear housing wall.

It may be desirable to locally and/or globally modify the appearance of a layer of glass (or other layer of material) in an electronic device. For example, it may be desirable to create attractive trim around a display, around the periphery of a camera window or button, or other suitable location. In some arrangements it may be desirable to selectively modify the appearance of a glass layer or other structure to form text, graphical patterns such as icons, logos, and/or other patterns visible to a user.

When creating structures such as these, there is a potential for unattractive features to develop on the glass layer. For example, if care is not taken, undesired shadowing may occur or surfaces may appear to sparkle excessively.

These concerns can be addressed by forming visually distinguishable areas on the glass layer (e.g., visually distinguishable regions for forming logos, text, etc.) using textured areas, neutrally colored or non-neutrally colored reflective coatings formed from a stack of alternating high and low index-of-refraction dielectric layers or other thin-film interference filter coatings (sometimes called dichroic layers or decoration layers), ink layers, adhesive layers, and/or other structures that selectively and/or globally impart visible changes to glass layers and other layers in an electronic device.

In forming the visually distinguishable areas, glass layers may be bonded together to form a solid glass layer with embedded decoration. For example, two or three layers of glass may be diffusion bonded by pressing polished surfaces of these layers into contact with each other and heating the layers to a temperature close to the glass transition temperature of the glass (e.g., within 10° C., within 50° C., or within another suitable amount). This causes the surfaces of the glass layers that are in contact with each other to chemically bond with each other, thereby fusing these glass layers together to form a single solid glass layer. Coatings, textures, cavities, and/or other structures may be formed on one or both of the mating surfaces of the layers of glass that are being bonded. In this way, patterns of visually distinguished structures (sometimes referred to as decoration) may be embedded within a glass housing wall or other layer of glass in an electronic device.

An illustrative electronic device of the type that may include diffusion-bonded glass structures with embedded patterned structures is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, titanium, gold, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies.

Display 14 may include one or more layers of glass. For example, the outermost layer of display 14, which may sometimes be referred to as a display cover layer, may be formed from a hard transparent material such as glass to help protect display 14 from damage. Other portions of device 10 such as portions of housing 12 and/or other structures may also be formed from glass. For example, walls in housing 12 such as a rear housing wall may be formed from glass.

Figure 2:
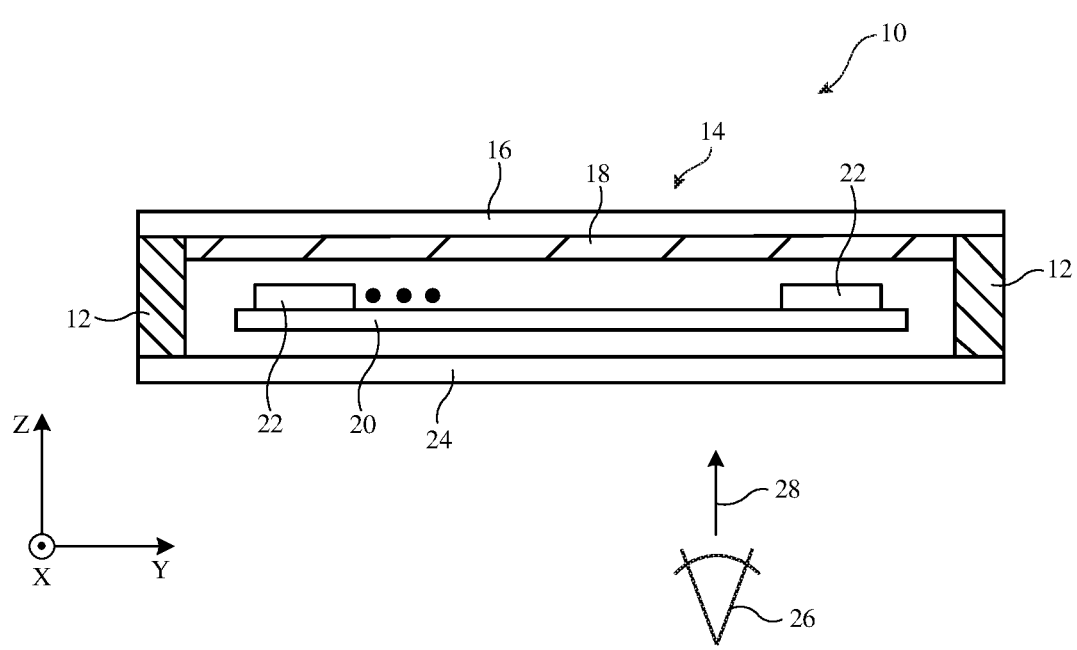
FIG. 2 is a cross-sectional side view of an illustrative electronic device in accordance with an embodiment.

FIG. 2 is a cross-sectional side view of an illustrative device that contains glass structures such as device 10 of FIG. 1. As shown in FIG. 2, device 10 may have opposing front and rear faces. Display 14 may be formed on the front face of device 10. Housing 12 may have a rear housing wall formed from layer 24 on the opposing rear face of device 10. Portions of housing 12 may also form sidewalls for device 10. These sidewall portions of housing 12 may be formed from a material such metal (as an example).

Display 14 may include display cover layer 16 (e.g., a layer of glass) and display module 18 (e.g., display layers that form an array of pixels that present images for a user on the front face of device 10). Display module 18 may be a liquid crystal display structure, an organic light-emitting diode display structure, or other suitable display. During operation, module 18 may present images that are viewable through display cover layer 16. The rear of the housing for device 10 may be formed from a glass structure (e.g., layer 24 may be a glass layer, sometimes referred to as a glass housing wall or glass housing layer). The thickness of layer 24 may be 0.2-5 mm, at least 0.05 mm, at least 0.1 mm, at least 0.2 mm, at least 0.5 mm, at least 0.75 mm, less than 1 mm, less than 2 mm, or other suitable thickness.

Layer 24 may be formed from multiple layers (e.g., multiple glass layers) that are bonded together. In this type of arrangement, layer 24 may have an outer layer and an inner layer. The outer layer may have a thickness of 0.2-5 mm, at least 0.05 mm, at least 0.1 mm, at least 0.2 mm, at least 0.5 mm, at least 0.75 mm, less than 1 mm, less than 2 mm, or other suitable thickness and the inner layer may have a thickness of 0.2-5 mm, at least 0.05 mm, at least 0.1 mm, at least 0.2 mm, at least 0.5 mm, at least 0.75 mm, less than 1 mm, less than 2 mm. The inner layer may be thicker than the outer layer in some configurations (e.g., the inner layer may be at least twice as thick as the outer layer, may be at least 5 times as thick as the outer layer, etc.). In other arrangements, the outer layer may be thicker than the inner layer. Arrangements in which layer 24 is formed from an outer layer, an inner layer, and an interposed intermediate layer may also be used. In these configurations, the intermediate layer may have a thickness 0.2-5 mm, at least 0.05 mm, at least 0.1 mm, at least 0.2 mm, at least 0.5 mm, at least 0.75 mm, less than 1 mm, less than 2 mm, or other suitable thickness.

If desired, a metal plate or other strengthening structures may be laminated to the inner surface of layer 24 to enhance strength. In some configurations, inner coating layers such as a layer of colored ink or other material may be formed on the inner surface of layer 24 (e.g., to adjust the outward appearance of layer 24, to hide internal components from view, etc.). Internal components in device 10 such as components 22 (e.g., electrical components such as integrated circuits, sensors, etc.) may be mounted on one or more substrates such as printed circuit 20.

Inactive border areas in layer 16 and portions of other glass structures in device 10 such as some or all of glass layer 24 may be covered with coatings and other structures. In some arrangements, a coating may be used primarily to block light (e.g., to hide internal device structures from view). For example, a coating may be formed on the inner surface of layer 24 to hide internal components from view from a user such as viewer 26 who is viewing device 10 in direction 28. In other arrangements, a patterned coating may be used to form text, logos, trim, and/or other visible patterns. Coatings that are unpatterned and that coat all of glass layer 24 may also be used to block internal structures from view and/or to provide device 10 with a desired appearance. Patterned coatings may create visible elements and may also block internal structures from view.

Coatings for glass structures in device 10 may be black or other neutral colors or may have non-black (non-neutral) colors (e.g., blue, red, yellow, gold, rose gold, red-violet, pink, etc.). In some configurations, some or all of the coatings for glass structures in device 10 may be shiny (e.g., exhibiting a mirror-like reflective surface with a reflectance of at least 50%, at less 80%, at least 95%, less than 99.99%, or other suitable reflectance).

If desired, textured decoration may be formed for device 10 by texturing external glass surfaces of layer 24 and/or by texturing the surfaces of layers that are subsequently joined by diffusion bonding, thereby embedding the texture within the interior of layer 24. In some configurations, layer 24 is provided with coatings on the exterior surfaces of layer 24. Coatings can also be embedded in glass layer 24 (e.g., by depositing a coating on a glass layer surface of a glass layer and diffusion bonding that glass layer surface to a mating glass layer surface of another glass layer).

Coatings on glass layer 24 and/or other glass structures in device 10 may be formed from metals, semiconductors, and/or dielectrics. Dielectric materials for the coatings may include organic materials such as polymer layers and/or inorganic materials such as oxide layers, nitride layers, and/or other inorganic dielectric materials. In arrangements in which a shiny surface is desired, a metal coating with a high reflectivity or a thin-film interference filter with dielectric layers (e.g., a stack of dielectric layers of alternating higher and lower refractive index values) may be configured to serve as a mirror coating (reflective coating). Ink coatings may also be incorporated.

Figure 3:
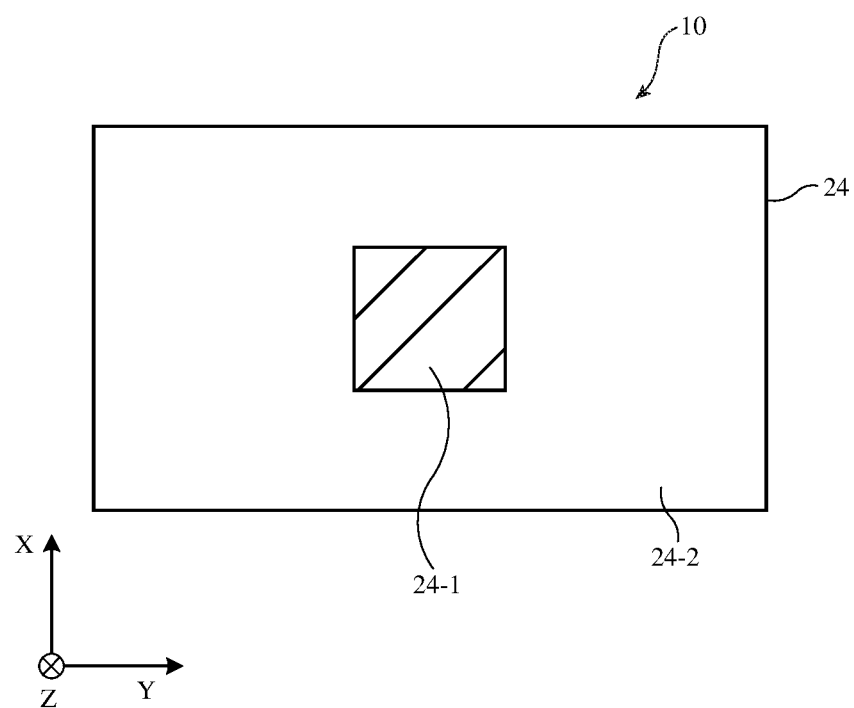
FIG. 3 is a rear view of an illustrative electronic device in accordance with an embodiment.

FIG. 3 is a top view of an illustrative configuration for the rear face of device 10 in which one region (region 24-1) has a first appearance (textured, shiny, a particular color, etc.) and has a first shape (e.g., text, a logo, a trim pattern, or other patterned shape) and in which another region (background region 24-2 in this example) has a second appearance (e.g., textured, shiny, a particular color, etc.). In order to ensure that region 24-1 is visible to a user of device 10, the appearances of regions 24-1 and 24-2 may contrast with each other. For example, in a scenario in which region 24-1 is reflective (e.g., a scenario in which region 24-1 is a shiny silver or gold region associated with a logo, text, etc.), region 24-2 may have a matte finish.

Glass layer 24 may have any suitable number of separately patterned regions such as regions 24-1 and 24-2, each of which may potentially have a different separate appearance. Configurations in which glass layer 24 has one or more patterned textured and shiny regions may sometimes be described herein as an example. The regions of device 10 that have different appearances may be formed by selectively patterning glass layer 24, glass sublayers that are used in forming glass layer 24, and associated coatings, films, and other structures for glass layer 24. For example, these regions may be selectively formed by depositing coatings using physical vapor deposition, chemical vapor deposition, or other deposition techniques followed by photolithography and etching, using shadow-masking or other selective deposition techniques such as printing techniques, by using selective surface treatment such as selective laser treatment, selective roughening or polishing using mechanical or chemical-mechanical polishing equipment, selective treatment with machining equipment, sand-blasting equipment or blasting equipment using other particles, by roughening or otherwise processing the surfaces of polymer films using embossing tools, presses, and/or by using other equipment for selectively processing particular areas of coatings, films, and/or surfaces (e.g., glass layer surfaces).

Textured surfaces in layer 24 and/or in coatings, films, and/or other layers coupled to layer 24 may provide a matte finish. These textured surfaces may have protruding surface structures that are 100 s of nm to 1 micron in height (e.g., at least 100 nm, at least 500 nm, less than 5 microns, less than 1 micron). Such textured surfaces may have an RMS surface roughness of 100 nm to 2 microns or other suitable value that provides a desired appearance (e.g., a matte appearance). Smooth surfaces (e.g., polished surfaces or other smooth surfaces) may have protruding surface features that are less than 1 nm in height, less than 2 nm in height, less than 5 nm in height, less than 50 nm in height, etc.). Such smooth surfaces may have an RMS surface roughness of less the RMS surface roughness of the textured surfaces (e.g., an RMS surface roughness of less than 25 nm or other suitable value that provides a desired appearance such as a smooth potentially reflective appearance). To form satisfactory glass-glass chemical bonds during diffusion bonding, glass bonding surfaces may be polished to a smooth finish (e.g., to an RMS surface roughness of less than 2 nm, less than 1 nm, or other suitable roughness value associated with a smooth polished finish). If desired, regions of the rear housing wall of device 10 or other glass-layer structures may have other roughness values (e.g., values intermediate to those associated with strongly textured matte finishes and smooth reflective finishes). The use of textured and smooth surfaces to form visually distinct regions of glass layer 24 is merely illustrative.

Figure 4:
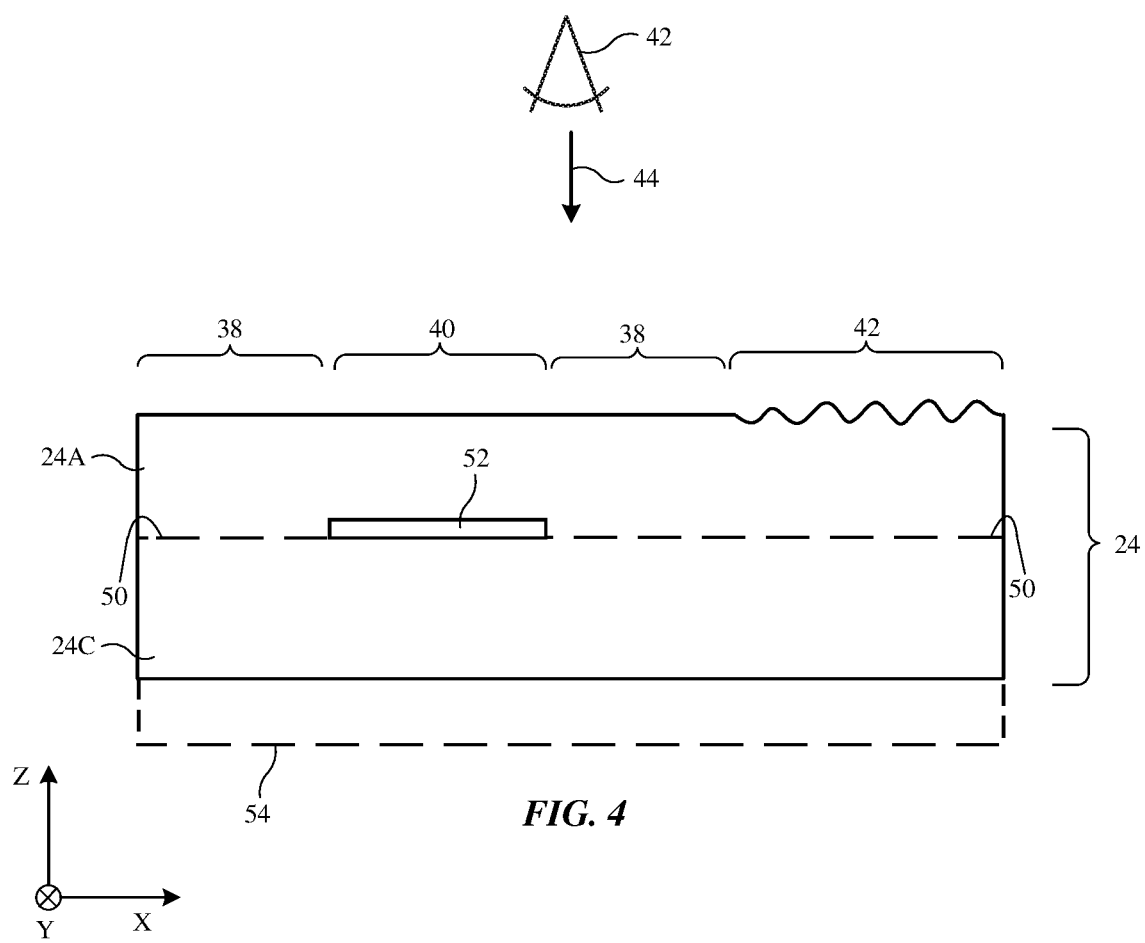
FIG. 4 is a cross-sectional side view of an illustrative glass layer with an embedded coating layer in accordance with an embodiment.
Figure 5:
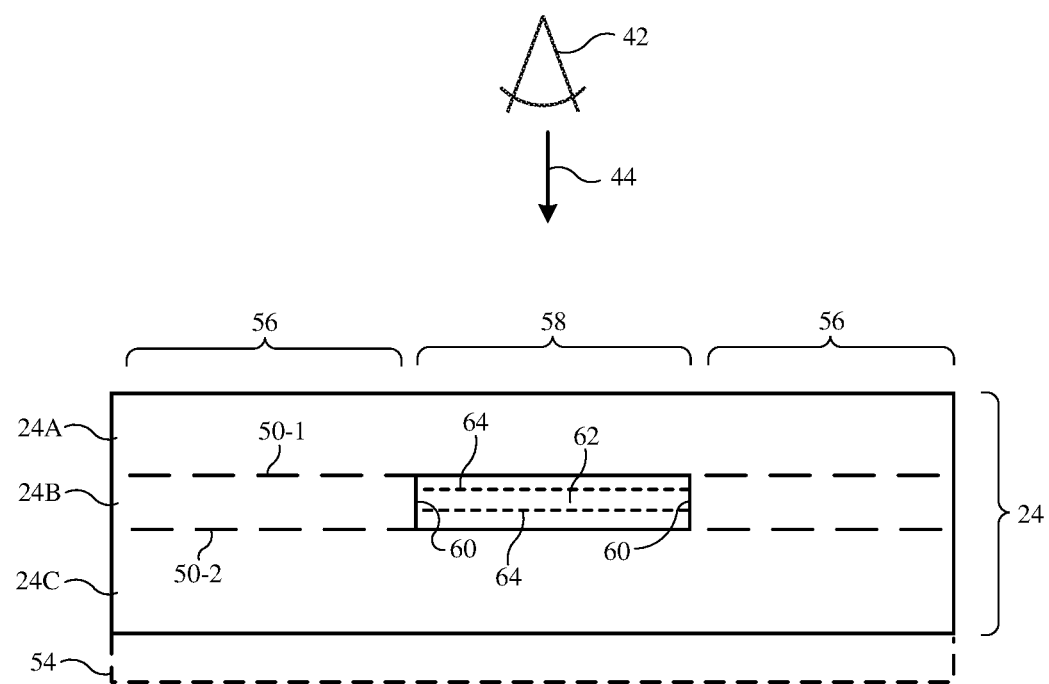
FIG. 5 is a cross-sectional side view of an illustrative glass layer with an embedded cavity in accordance with an embodiment.
Figure 6:
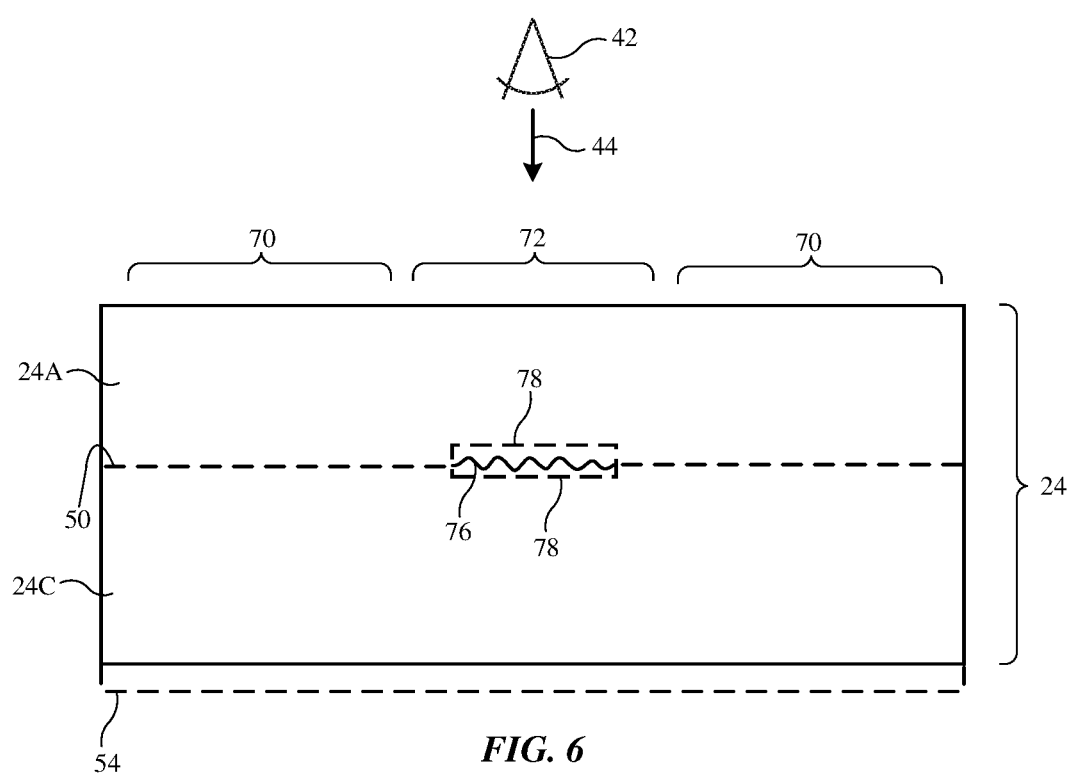
FIG. 6 is a cross-sectional side view of an illustrative glass layer with an embedded textured region in accordance with an embodiment.

FIGS. 4, 5 and 6 set forth various examples of patterned regions for a structure in device 10 such as a rear housing wall (e.g., glass layer 24) that have potentially different visual appearances. These regions may be used in forming logos, text, trim, and/or other patterns (sometimes referred to as decoration). There may be any suitable number of patterned regions on layer 24 and these layers may include textured backgrounds and smooth backgrounds, textured foregrounds and smooth backgrounds, background and foreground elements of different colors, reflectivity values, etc. Coatings may be provided on the outer surface of these illustrative patterned regions (e.g., antismudge coatings, antiscratch coatings, etc.) or, if desired, these external coating layers may be omitted and/or incorporated into the coatings, films, and surfaces forming layer 24. The examples of FIGS. 4, 5, and 6 are merely illustrative.

FIG. 4 is a cross-sectional side view of glass layer 24 in an illustrative configuration in which glass layer 24 is formed by bonding together a pair of glass layers. In particular, glass layer 24A and glass layer 24B may have polished bonding surfaces that are joined and chemically bonded at diffusion-bonding interface 50 using glass diffusion bonding (e.g., chemical bonds may be formed between layers 24A and 24B at interface 50 by heating layers 24A and 24 to a temperature close to the glass transition temperature of the glass material that forms layers 24A and 24B so that layers 24A and 24B join together to form a single glass housing wall such as layer 24). In addition to optionally patterning one or more of the exterior surfaces of glass layer 24, internal patterned structures may be formed in layer 24. These structures may be embedded within layer 24 by forming coatings, textures, recesses, and/or other features on one or both of the bonding surfaces associated with interface 50 (e.g., the lower surface of layer 24A and/or the mating upper surface of layer 24C) before these surfaces are bonded together.

In the illustrative example of FIG. 4, layer 24 has been patterned to form regions with different appearances. Region 38 may, for example, have a shiny appearance and optional textured region 42 may have a matte appearance due to the formation of a texture on the outer surface of layer 24A. Region 40 may have an appearance that differs from that of region 38 and that of region 42 because coating layer 52 is embedded within layer 24 in region 40.

Coating layer 52 may be formed on the lower (inwardly facing) surface of layer 24A and/or on the outer (outwardly facing) surface of layer 24C. Coating layer 52 may be deposited after surface polishing of layers 24A and 24C or, if desired, may be deposited in a recessed portion of layer 24A and/or 24C followed by surface polishing (e.g., to create a polished surface in which the outermost portion of coating layer 52 is flush with the surface of the glass layer (layer 24A and/or 24C) on which coating layer 52 has been deposited.

To ensure that coating layer 52 is not damaged during glass bonding operations associated with joining layers 24A and 24C, coating layer 52 may be formed from materials such as inorganic dielectric materials that can withstand elevated processing temperatures (e.g., silicon oxide, silicon nitride, titanium oxide, tantalum oxide, zirconium oxide, aluminum oxide, niobium oxide, and/or other inorganic dielectrics). Other materials (e.g., metals) can also be used in coating layer 52, if desired.

With one illustrative configuration, coating layer 52 may be formed from a thin-film interference filter structure having a stack of dielectric layers. The layers in the dielectric stack may have alternating refractive index values and may be configured to form a thin-film interference filter (sometimes referred to as a dichroic filter) with a desired reflection and transmission spectrum. Coatings 52 may, in general, include one or more layers of material (e.g., one or more dielectric layers) and/or one or more different types of material (dielectric, conductive material, semiconductor, etc.).

As shown in FIG. 4, an optional coating layer such as coating layer 54 may be formed on the inner surface of layer 24C. Coating layer 54 may be a global layer that covers all of the inner surface of layer 24 (as an example). Embedded coating layer 52 may be formed only in region 40 (as an example). Region 38, which may surround region 40 may have an appearance that differs from that of regions 40 and 42. Coating layer 54 may, if desired, be an ink layer (e.g., a polymer coating layer that includes colorant such as embedded pigment and/or dye), may be a dielectric stack that forms a thin-film interference filter, may be a metal layer, may be other coating layer(s), and/or may be formed from a combination of such layers.

Embedded coating 52 and rear coating 54 may be shiny. For example, a stack of multiple dielectric layers in coating 52 and/or 54 may have alternating index of refraction values to form a thin-film interference filter or coating 52 and/or coating 54 may include a reflective material such as metal. The texture of the outer surface of layer 24 in region 42 may provide glass layer 24 with a pleasing feeling to the touch. If desired, the texture of region 42 may overlap coating 52 and/or other portions of layer 24 or the texture of region 42 may be omitted. Coating 52 in region 40, which may be a physical vapor deposition coating deposited through a shadow mask or other patterned layer, may be shaped to form text, a logo, or other visual element (decoration) and may provide layer 24 with a different appearance in region 40 that in regions 38 and 42. Coating 54 (and, if desired, coating 52) may help hide internal components from view by blocking light transmission into the interior of device 10. If desired, coating 54 may be formed from an opaque material such as neutrally colored (white, black, or gray) or non-neutrally colored (red, blue, yellow, etc.) ink.

In the illustrative configuration of FIG. 5, three separate glass layers 24A, 24B, and 24C have been bonded together using diffusion bonding to form a single unified glass layer (glass layer 24) with an embedded cavity (cavity 62). Layer 24 may have regions with different appearances. For example, region 58, which overlaps cavity 62, may have a different appearance of than region 56, which surrounds region 58.

During glass bonding, the outer surface of glass layer 24B may be diffusion bonded to the opposing inner surface of glass layer 24A at interface 50-1 and the outer surface of glass layer 24C may be bonded to the inner surface of layer 24B at interface 50-2. Following diffusion bonding, chemical bonds are formed at interfaces 50-1 and 50-2 so that layers 24A, 24B, and 24C join to form a single piece of glass (layer 24).

As shown in FIG. 5, glass layer 24B has an opening in region 58 (e.g., an opening in the shape of a logo, trim, and/or other decoration pattern). When glass layers 24A, 24B, and 24C are bonded together, opening 62 becomes embedded within layer 24. Cavity 62 may be filled with air or other gas. Optional coatings such as coatings 64 may be formed on the inner surface of layer 24A in region 58 and/or on the outer surface of layer 24C in region 58 (e.g., on an upper and/or lower cavity surface or other cavity surface such as a cavity sidewall surface). Coating(s) 64 may be a thin-film interference coating formed from a dielectric stack (e.g., inorganic materials that can withstand the elevated temperatures involved in diffusing bonding). Coating(s) 64 and cavity 62 may have a shape (an outline when viewed in direction 44) of a logo or other suitable shape. Optional rear coating 54 may be applied to the inner surface of layer 24 after high temperature processing is complete.

Another illustrative arrangement for layer 24 is shown in FIG. 6. In the example of FIG. 6, two glass layers 24A and 24C are diffusion bonded at interface 50 to form layer 24. As shown in FIG. 6, a textured surface 76 is formed in region 72, so that region 72 has a different appearance than region 70. Textured surface 76 may be formed on the inner surface of layer 24A and/or the outer surface of layer 24C. In region 70, the contacting (bonding) surfaces of layers 24A and 24C are polished to allow layers 24A and 24C to be joined together using diffusion bonding. After joining, textured surface 76 will form an internal texture that appears different than the bonded interface formed by joining the two polished surfaces of layers 24A and 24C. This is because textured surface 76 does not receive a good planar diffusion bond following diffusion bonding operations due to the lack of polish in textured surface 76. As a result, textured surface 76 will effectively include small air gaps or pores after diffusion bonding operations are complete and theses air gaps provide surface 76 with a different appearance than the bonded interface in region 70. Optional coating 78 may be formed on the polished and/or textured lower surface of layer 24A in region 72 and/or may be formed on the polished and/or textured upper surface of layer 24C in region 72. Coating 78 may be a thin-film interference filter coating formed from a dielectric stack (e.g., a stack of inorganic dielectric materials of alternating index of refraction) and/or may include other materials such as metals. Coating 78 and other embedded coatings in layer 24 may be formed from materials that withstand damage at elevated temperatures (e.g., temperatures at or near the glass transition temperature of the glass material used to form layer 24).

As described in connection with FIG. 5, optional rear coating layer 54 may be formed over some or all of the rear surface of layer 24C. As described in connection with FIG. 4, some or all of the upper surface of layer 24A may be textured, as shown by the textured surface of region 42. If desired, some or all of the rear surface of layer 24C may be textured, selected areas of the upper surface of layer 24A may be provided with coatings such as coating 54, and/or other decoration structures may be formed for layer 24.

The foregoing is merely illustrative and various modifications can be made to the described embodiments. The foregoing embodiments may be implemented individually or in any combination.

What is claimed is:

1. An electronic device having opposing front and rear faces, comprising:
    a display on the front face; and
    a glass housing wall on the rear face, wherein the glass housing wall is formed from a first layer of glass and a second layer of glass that are joined with chemical bonds at a diffusion-bonding interface, the glass housing wall has first and second regions of first and second different respective appearances, the glass housing wall comprises a coating layer that is embedded between the first and second layers of glass, the coating layer overlaps the first region and does not overlap the second region, and the first layer of glass has a textured glass surface in the first region and a smooth glass surface in the second region.

2. The electronic device defined in claim 1 wherein the coating layer comprises inorganic dielectric.

3. The electronic device defined in claim 1 wherein the coating layer comprises a thin-film interference filter formed from a stack of inorganic dielectric layers.

4. The electronic device defined in claim 1 wherein the coating layer of the first region is configured to form a logo.

5. The electronic device defined in claim 1 further comprising a polymer layer on the glass housing wall that overlaps the first and second regions.

6. The electronic device defined in claim 5 wherein the polymer layer is opaque.

7. The electronic device defined in claim 1 wherein the textured glass surface overlaps the first region and does not overlap the second region.

8. An electronic device having opposing front and rear faces, comprising:
   a display on the front face; and
   a glass housing wall on the rear face that has an embedded cavity, wherein the glass housing wall is formed from glass portions that are joined with chemical bonds at a diffusion-bonding interface that extends around an entire perimeter of the embedded cavity, the glass portions comprise first and second glass layers, the first glass layer has a textured glass surface formed from protruding surface structures, and the textured glass surface is interposed between the first and second glass layers.

9. The electronic device defined in claim 8 wherein the glass housing wall has first and second regions of first and second different respective appearances and wherein the first region overlaps the embedded cavity.

10. The electronic device defined in claim 9 wherein the glass portions comprise a third glass layer, wherein the second glass layer is interposed between the first and third glass layers and has an opening that forms the embedded cavity, wherein the first and second glass layers are joined with chemical bonds at a first diffusion-bonding interface, and wherein the second and third glass layers are joined with chemical bonds at a second diffusion-bonding interface.

11. The electronic device defined in claim 10 further comprising a coating layer in the embedded cavity.

12. The electronic device defined in claim 11 wherein the coating layer comprises a dielectric stack of inorganic dielectric layers.

13. The electronic device defined in claim 11 wherein the coating layer comprises metal.

14. The electronic device defined in claim 11 wherein the coating layer is configured to form a logo.

15. An electronic device, comprising:
   a housing that includes a glass housing wall with embedded decoration, wherein the glass housing wall is formed from glass structures that are joined with chemical bonds at a diffusion-bonding interface, the glass structures comprise first and second glass layers, the first glass layer has a polished surface at the diffusion-bonding interface and a textured glass surface that forms the embedded decoration, and the textured glass surface is formed from protruding surface structures and is interposed between the first and second glass layers; and
   electrical components surrounded by the housing.

16. The electronic device defined in claim 15 wherein the glass housing wall has first and second regions of first and second different respective appearances and wherein the first region overlaps the embedded decoration.

17. The electronic device defined in claim 15 wherein the electronic device has opposing front and rear faces, wherein the glass housing wall is on the rear face, and wherein the electronic device further comprises a display on the front face.

\* \* \* \* \*